(12) United States Patent
Ikeya

(10) Patent No.: US 6,402,537 B2
(45) Date of Patent: Jun. 11, 2002

(54) SOCKET FOR REMOVABLY MOUNTING AN ELECTRONIC PART

(75) Inventor: Kiyokazu Ikeya, Shizuoka (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/891,801

(22) Filed: Jun. 26, 2001

(51) Int. Cl.[7] .................................................. H01R 13/15
(52) U.S. Cl. ...................................... 439/259; 439/342
(58) Field of Search ................................. 439/259, 266, 439/268, 263, 264, 265, 342, 330, 331, 343, 70, 71

(56) References Cited

U.S. PATENT DOCUMENTS

| | | | |
|---|---|---|---|
| 4,468,072 A | 8/1984 | Sadigh-Behzadi | 439/266 |
| 5,147,213 A | 9/1992 | Funk et al. | |
| 5,556,293 A * | 9/1996 | Pfaff | 439/266 |
| 5,800,194 A * | 9/1998 | Yamagishi | 439/266 |
| 5,807,127 A | 9/1998 | Ohshima | 439/266 |
| 6,027,355 A | 2/2000 | Ikeya | 439/266 |
| 6,050,836 A | 4/2000 | Tohyama | 439/266 |
| 6,126,467 A | 4/2000 | Ohashi | 439/268 |
| 6,149,449 A * | 11/2000 | Abe | 439/268 |
| 6,168,449 B1 * | 1/2001 | Huang et al. | 439/259 |
| 6,287,127 B1 * | 9/2001 | Hibino et al. | 439/70 |
| 6,296,504 B1 * | 10/2001 | Ohashi | 439/266 |

OTHER PUBLICATIONS

Pending U.S. Application No. 09/850,622 filed May 7, 2001, which is a continuation–in–part of U.S. Application No. 09/694,636 filed Nov. 23, 2000, which claims priority to Japanese Patent Application No. 11(1999)–341360 filed Nov. 30, 1999. This application claims priority to Japanese Patent Application No. 2000–147533 filed May 19,2000.

* cited by examiner

Primary Examiner—P. Austin Bradley
Assistant Examiner—Ross Gushi
(74) Attorney, Agent, or Firm—Russell E. Baumann; Frederick J. Telecky, Jr.

(57) ABSTRACT

A socket (2) for removably mounting a BGA package. A plurality of contacts (7) are mounted in a base (4), the contacts each having a pair of arms (7a and 7b) for effecting compressive electrical contact of the solder balls of the BGA package being held. A slider (5) is slidably mounted on the base (4) for opening and closing of the arms. An external force is applied in a prescribed direction at a cam follower portion (52) of the slider by a cam member (20) provided on a diagonal line of a generally square base (4). The cam engages the cam follower portion (52) of the slider at a selected angle of inclination and is movable in a direction which crosses, at a right angle, the moving direction of the slider.

12 Claims, 6 Drawing Sheets

SOCKET FOR REMOVABLY MOUNTING AN ELECTRONIC PART

FIELD OF THE INVENTION

This invention relates generally to electrical property and burn-in tests for electronic parts, such as integrated circuits, and more particularly to a socket for providing an electrical connection between each terminal of an electronic part and an external device for removably loading the electronic part in the socket so that the leads of the socket are electrically connected to the respective terminals of the electronic part.

BACKGROUND OF THE INVENTION

Generally, electronic parts such as IC packages, in which IC chips have been sealed with plastic, are subjected to a reliability test called an electric property test or a burn-in test prior to their shipment in order to distinguish between acceptable and unacceptable products.

In electric property tests, input and output characteristics of the IC chips, pulse properties, noise leeway, and the like are tested. In burn-in tests, on the other hand, IC packages that have passed the electric property test are arranged in an oven and are made to function at an elevated temperature, 125° centigrade, for instance, and under a source voltage which is approximately 20% higher than the rated value. Those IC packages which fail in the burn-in test are removed as being unacceptable and only those others which continue functioning properly are shipped out as acceptable products.

In recent years, BGA (Ball Grid Array) packages having terminals made of solder balls positioned on the lower side of the package in a selected matrix, e.g., a zigzag fashion, have become popular as a desirable surface-loading type IC package. A BGA package provides advantages including features in which the terminals can be widely set while maintaining small outer dimensions and that the terminals are sturdy and resistant to deformation when they are brought into contact with other parts.

BACKGROUND OF THE INVENTION

FIGS. 6(a) and 6(b) show a conventional socket for loading a BGA package for a burn-in test. Socket 101 has a square-shaped base 102 and a slider 103 for loading BGA package 100 is arranged for movement in a horizontal direction on the base. A cover 104, having an opening 104a therein, is received at the top of base 102. Cover 104 is vertically movable relative to base 102 by means of compression coil springs 105. A through hole is formed in slider 103 and base 102 corresponding to each solder ball 100a of the BGA package. A respective contact 106 for electrical connection with each solder ball 100a of the BGA package is arranged to extend through the through holes of base 102 and slider 103. Each contact 106 is made of an elongated metallic member with a pair of arms 106a and 106b facing upward. A protuberant part, not shown in the drawing, is provided on one arm of arms 106a and 106b (e.g., arm 106a) and, as this protuberant part engages the partition wall of slider 103, arms 106a and 106b are adapted to open and close upon sliding motion of the slider. A sliding mechanism for moving slider 103 in a direction which is in parallel with the bottom wall of base 102 is provided on opposite sides of the slider. The sliding mechanism includes a generally L-shaped lever member 108 rotatably mounted on each end of a shaft 107 provided at one side of base 102 (the right side in the drawings) and the short arm 108a of lever member 108 is rotatably linked to shaft 109 disposed in a vertically extending slot in slider 103 and which extends in parallel relation with shaft 107. A lever member 111 is rotatably mounted on each end of shaft 110 provided at the opposite side of base 102 and the tip of lever member 108 is slidingly attached by a pin 112 in a slot formed in each respective lever member 111 intermediate to its opposite ends. When cover 104 is not pressed, tip 111a of each lever member 111 is adapted to touch the protuberant part 104b of cover 104. Compression coil springs 113 are located in the vicinity of shaft 110 for biasing the slider toward the right as seen in the drawings.

In a socket made as described above, when cover 104 is pressed down from the state shown in FIG. 6(a) to the state shown in FIG. 6(b), lever members 108 and 111 rotate toward base 102 and shaft 109 transfers motion to slider 103 in conformity with the movement of lever member 108, thereby causing the slider to shift in the X-direction. As a result, arm 106a of the arms of each contact 106 starts opening due to engagement with the partition wall of slider 103. If, in this state, BGA package 100 is inserted through the central opening 104a of cover 104, BGA package 100 is positioned by guide 103c so that each solder ball 100a enters between arms 106a and 106b of a respective contact 106.

When the downward force on cover 104 is removed, lever members 108 and 111 rise and slider 103 is returned in the X+ direction by the force of coil springs 113 and the stored force of the contact arms, with a result that arms 106a and 106b of each contact 106 are closed and each solder ball 100a of BGA package 100 is held by arms 106a and 106b of a respective contact 106. Thus, each solder ball 100a of BGA package 100 is electrically connected to a respective contact 106.

With respect to a conventional socket 101 as described above, the linkage mechanism comprising the lever members 108 and 111, pin 112 and shafts 107, 109 and 110 is used to move slider 103. However, the number of parts involved is considerable and the construction becomes complicated, thereby requiring a number of assembly steps with concomitant assembly time before completion. Further, the use of the linkage mechanism adds to the size and weight of socket 101 making it larger and heavier than desired.

In copending applications, U.S. Ser. Nos. 09/694,636 and 09/850,622 filed respectively on Oct. 23, 2000 and May 7, 2001, and assigned to the assignee of the present invention, prior art linkage mechanisms of the type described are obviated by directly pressing the slider of the main socket body by means of a force applying member provided on a jig for loading the electronic part to be tested. The force applying member has a surface inclined at a selected angle and the force applying member of the jig is moved vertically toward and away from the socket, thereby making it possible for the slider of the main socket body to move in a direction normal to the movement of the force applying member, i.e., horizontal versus vertical directions.

In view of the fact that the amount of movement of the slider is therefore dependent upon the inclined angle of the force applying member of the jig that employs such a mechanism, there is a problem in that the degree of opening of the arms of the contact varies from one jig to another. Much of this depends on the precision with which the parts of the jig are made, with a result that the amount of opening of the contact arms cannot be controlled by the structure of the socket body alone.

SUMMARY OF THE INVENTION

An object of the present invention is to provide an apparatus which overcomes the above noted limitations of the prior art. Another object of the invention is the provision of a socket in which the amount of opening of the arm-like contact part of the contact member can be predetermined at a certain value by means of the socket itself without depending upon the accuracy of the various parts of the jig.

A socket made in accordance with the invention comprises a main socket body for removably receiving an electronic part in which the terminals of the electronic part are arranged according to a selected pattern. A plurality of contact members are arranged in the main socket body in conformity with the terminal pattern of the electronic part. Each contact member has a pair of contact arms, capable of elastically opening and closing to effect compressive electrical engagement with a respective connective terminal of the electronic part. A contact opening and closing member has an engagement part adapted for engagement with the contact members to move the contact arms in the opening and closing direction by receiving an external force that is approximately in parallel with the opening and closing direction of the contact arms applied at a cam follower portion of the contact opening and closing member. A force transfer cam member, provided at a selected location on the edge portion of the main socket body, has a cam surface that engages the cam follower portion of the contact opening and closing member at a selected angle and which is movable in a direction which crosses, at approximately a right angle, the moving direction of the contact opening and closing member so as to cam the cam follower portion, while sliding there against. According to a feature of the invention, the cam member is mounted on the main socket body, with the contact arms of each contact member being opened by the action of the cam member. This arrangement provides the ability to control the accuracy of the cam follower portion of the contact opening and closing member and the position of the cam member within the socket without depending upon the accuracy of the parts of the separately provided jig so that the amount of the opening of the contact arms of each contact member can be determined more consistently. According to another feature of the invention, the cam member is formed as a button type member having a head of a size suitable to enable one to press the cam member with a finger, for example, so that one can press down the cam member with one hand in connection with unloading the electronic part from the socket. Thus, the operability of a manual unloading operation can be improved by locating the cam member on the edge portion of the main socket body so that the seating area for the electronic part can be more fully exposed to further improve the operability of the unloading operation. According to yet another feature of the invention, the main socket body can be formed in a rectangular configuration, such as in the shape of a square, with the contact opening and closing member being arranged so that the engagement of the contact opening and closing member moves the arms of the contact members in a direction which is in parallel with the imaginary diagonal line of the main socket body. The contact opening and closing member itself can be guided in the diagonal direction and in the preferred embodiment, the cam member is arranged at one corner on the diagonal line of the main socket body.

Accordingly, a single cam member is sufficient to move the contact opening and closing member. As a consequence of this, the number of parts whose accuracy has to be controlled is reduced, thereby making it possible to better control the amount of opening of the contact arms of each contact member.

According to a feature of the invention, a plurality of depressions or longitudinal grooves of a selected size can be formed in the cam surface of the cam member to reduce the surface area of the cam member which engages the cam follower portion of the contact opening and closing member. Accordingly, it becomes possible to reduce the frictional resistance when the cam member slides over the cam follower portion of the contact opening and closing member.

According to another feature, an electronic part holding mechanism is provided which is movable while maintaining a state facing the main socket body of the socket in order to load an electronic part. The holding mechanism is part of a contact opening and closing jig that has a force applying part that is engageable with the cam member of the socket. Thus, it is only necessary to provide one force applying location on the contact opening and closing jig for effecting movement of the contact opening and closing member by means of the cam member. Accordingly, it becomes possible to reduce the size of the contact opening and closing jig itself and the number of parts of the contact opening and closing jig.

BRIEF DESCRIPTION OF THE DRAWINGS

Other objects, advantages and details of the novel and improved socket of the invention appear in the following detailed description of preferred embodiments of the invention, the detailed description referring to the drawings in which.

DETAILED DESCRIPTION OF PREFERRED EMBODIMENTS

Figure 1:
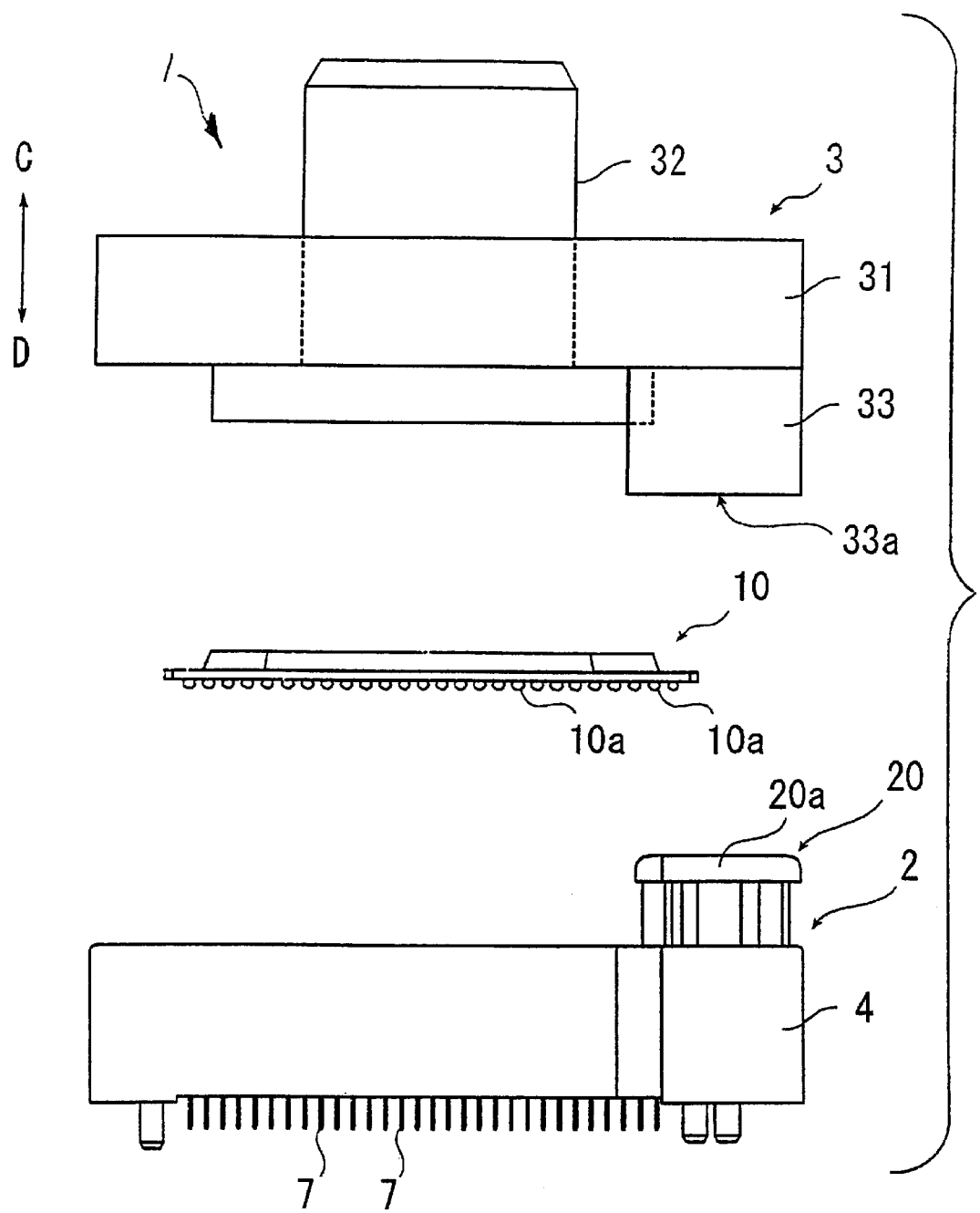
FIG. 1 is a side elevational view showing a simplified structure of an electronic part loading system 1 comprising a contact opening and closing jig 3 and a socket 2 made according to a preferred embodiment of the invention along with an electronic part 10.
Figure 2A:
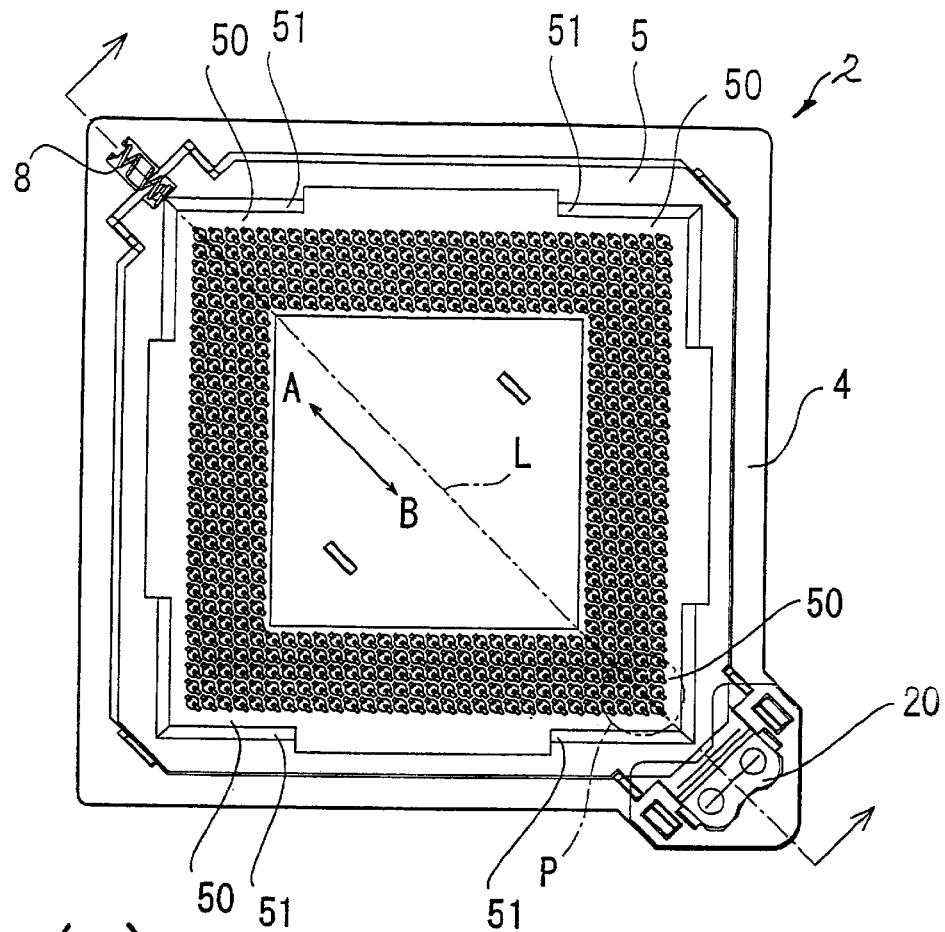
FIG. 2(a) is a top plan view showing a simplified structure of the socket according to the FIG. 1 embodiment.
Figure 3:
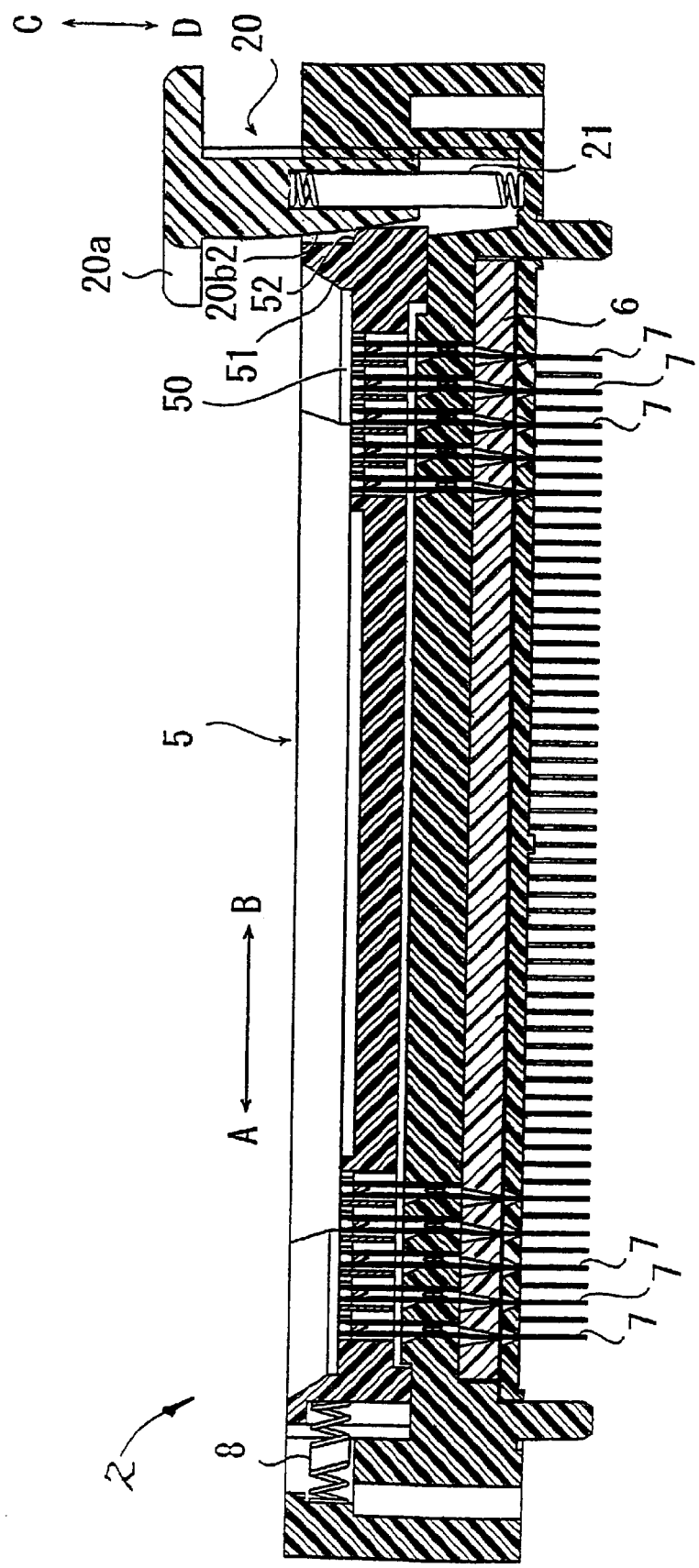
FIG. 3 is a cross sectional view taken on the diagonal line L in FIG. 2(a)

As shown in FIG. 1, electronic part loading system 1 made according to a preferred embodiment of the invention is for loading a BGA package (electronic part) 10 on which solder balls (connective terminals) 10a are arranged according to a selected pattern. Loading system 1 comprises a socket 2 for removably mounting the BGA package and a combination electronic part delivery mechanism and contact opening and closing jig (contact opening and closing jig) 3 which is arranged facing the socket. With particular reference to FIG. 2(a), socket 2 comprises a base (main socket body) 4 and a slider (contact opening and closing member) 5 received on the base. The socket and slider are made using suitable resinous material such as polyether imide, etc. Base 4 is adapted for mounting on a wired substrate such as a printed substrate not shown in the drawing. The base is preferably formed in a rectangular configuration, such as a square, for example. As shown in FIG. 3, a stopper 6 is provided at the bottom of the base at the center thereof. A large number of spaced apart longitudinally extending members 7 are arranged at a prescribed height in a direction which is perpendicular to the top and bottom surfaces of base 4 and are fixed by stopper 6 in order to prevent the contact members from slipping toward the bottom side of the base. Contact members 7 are arranged in conformity with the pattern of solder balls 10a of the BGA package 10 to be tested.

Figure 2B:
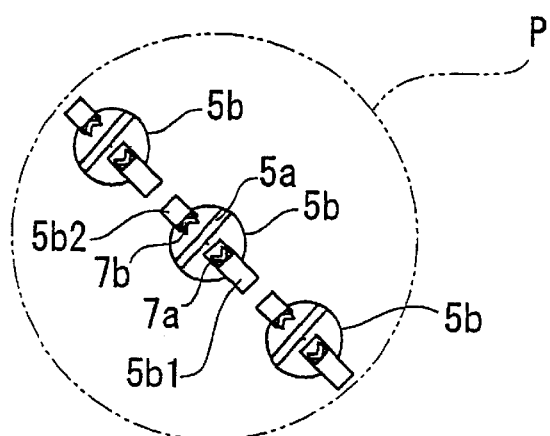
FIG. 2(b) is an enlarged portion of FIG. 2(a) designated by a dashed line P in FIG. 2(a)

As shown in FIG. 2(b) or FIG. 4, a pair of elastically movable arms (contact arms) 7a and 7b are provided at the upper portion or tip of each contact member 7. According to this embodiment, arms 7a and 7b of each contact member are arranged facing each other in a direction which is in parallel with the diagonal line L of base 4. As shown in FIG. 2(a), slider 5 is formed generally in the shape of but smaller in size than the base. Slider 5 is arranged for movement on base 4 in a direction (indicated either by arrow head A or B) which also is in parallel with diagonal line L of base 4.

Figure 4A:
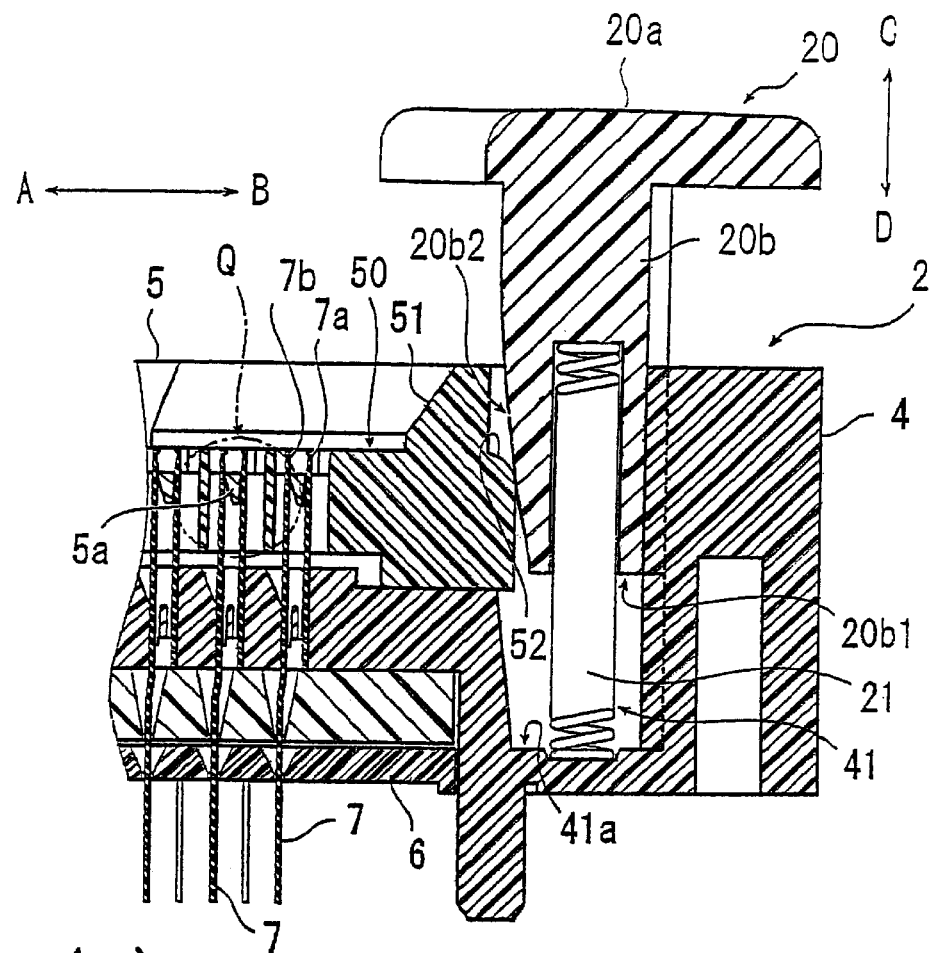
FIG. 4(a) is an enlarged, broken away portion of FIG. 3.
Figure 4B:
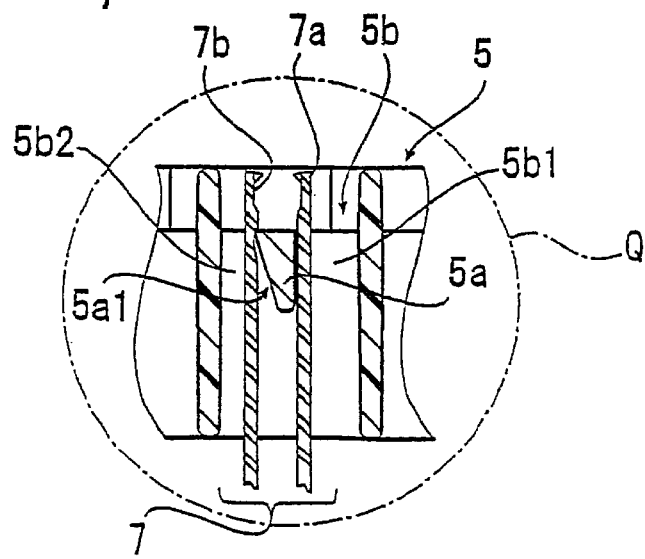
FIG. 4(b) is a further enlarged portion of FIG. 4(a) designated by a dashed line Q in FIG. 4(a)

A seating portion 50 is provided on the upper surface of slider 5 for receiving BGA package 10. A positioning guiding part 51 is located around seating portion 50 for guiding and positioning the BGA package on the seating portion. A large number of IC ball accommodating holes 5b are arranged on seating portion 50 on the upper surface of slider 5 in conformity with the pattern of contact members 7. As shown in FIGS. 4(a) and 4(b), an engagement part 5a of the slider is respectively provided in each IC ball accommodating hole 5b. These engagement parts 5a have a guiding surface 5a1 formed in such a way as to incline toward its opposite side as one moves in a downward direction as shown in the drawing. Each of the aforesaid contact members 7 is arranged in a respective IC ball accommodating hole 5b with arms 7a, 7b received on opposite sides of engagement part 5a in hole portions 5b1 and 5b2, respectively. One arm 7b of the pair of arms 7a and 7b of each contact member is arranged to move in a direction (indicated by an arrow head A) which is away from arm 7a by the camming action of guide surface 5a1 of engagement part 5a of slider 5 in conformity with the movement of slider 5 in the direction indicated by the arrow head, thereby making it possible for the pair of arms 7a and 7b of each contact member 7 to open at a distance which is somewhat larger than the outer shape of the solder balls 10a of BGA package 10.

A first compression coil spring 8 is mounted at one corner of base 4 on diagonal line L providing a spring bias on slider 5 toward the side of the other corner on diagonal line L as shown in FIGS. 2 or 3.

A cam member 20 in the shape of a button is provided at the corner of base 4 diametrically opposite to spring 8. As shown in FIG. 4(a), cam member 20 has a head 20a at one end of an elongated body 20b having a longitudinal axis F. The upper surface of head 20a is flat while body 20b has a selected length extending in a direction that crosses the upper surface, at a right angle. Cam member 20 may be conveniently formed with resin similar to the resin used for slider 5, for instance. Preferably, resin for the cam contains glass fiber as a reinforcing agent and further contains a component for reducing friction such as polytetrafluorethylene. The area of the top surface of head portion 20a of cam member 20 is selected to be in the range of approximately 1/10 through 1/20 of the area of base 4. A guide hole 41 having a longitudinal axis E is formed in base 4 for slidably receiving body 20b of cam member 20. Guide hole 41 is formed to a depth which is somewhat less than the length of body 20b of cam member 20 in a direction (indicated either by arrow head C or arrow head D) which crosses, at a right angle, the moving direction of slider 5. Cam member 20 is preferably arranged so that the cam member can bottom out to ensure a predictable position of body 20b when the cam member is actuated. That is, bottom 41a of bore 40 serves as a stop surface for cam 20. The cam member is biased upwardly by the spring force of a second compression coil spring 21 received inside an open ended bore through bottom 20b1 of body 20b and seated in the bottom 41a of guide hole 41.

Slider 5 is formed with a force receiving or cam follower portion 52 at the corner and on the outer periphery of the side of the slider that faces cam member 20 for receiving the external force from cam member 20 in connection with opening and closing of arms 7a and 7b of contact member 7 as shown in FIG. 4(a). This cam follower portion 52 is formed having a curved surface facing the cam member in the shape of a convex configuration with a selected curvature, as shown in FIG. 4(a). Cam surface 20b2 is formed on the side surface of body 20b extending along the longitudinal axis of body 20b over at least a portion of its length and facing cam follower portion 52 of slider 5. Cam surface 20b2 is also formed having a curved surface in the shape of a convex configuration with a more gradual curvature (i.e., larger radius) than the curvature of cam follower portion 52 of slider 5 forming an angle therebetween which is suitable for slider 5 to move as a cam mechanism. Cam follower portion 52 of slider 5 maintains a state of being in linear engagement with cam surface 20b2 of the cam member 20 by means of the spring force of first compression coil spring 8 described above.

As shown in FIG. 1, contact opening and closing jig 3 has a head 31 moveable in the vertical direction shown by arrow head C or D, while maintaining a state facing base 4 of socket 2. An electronic part holding mechanism 32, mounted on head 31, is capable of adhering and holding BGA package 10 by air suction. At a selected location on head 31, further, a force applying member 33, which is adapted to engage head 20a of cam member 20 on the socket, extends downwardly from that part which applies suction to BGA package 10. An engagement surface 33a, which may be flat as shown, is formed on lower surface of force applying member 33.

In the embodiment described above, if contact opening and closing jig 3 is lowered in the direction indicated by arrow head D, the force applying member 33 of contact opening and closing jig 3 engages and depresses head 20a of cam member 20 until cam member 20 bottoms out against the surface 41a of guide hole or bore 41 of base 4. Guide bore 41 is preferably formed so that its longitudinal axis E extends in a direction generally normal to the top surface of the base on which the slider moves. The cam follower portion 52 of slider 5 receives the external force from force applying member 33 through cam member 20 which includes a component in the direction which is indicated by arrow head A as the cam surface 20b2 of cam member 20 slides along the curved surface of cam follower portion 52 of slider 5, as shown in FIG. 3. In this connection, wearing of cam follower portion 52 of slider 5 and cam member 20 is minimized due to the linear engagement between the two parts. Thus, slider 5 moves in the direction indicated by arrow head A for a fixed distance in response to the fixed stroke of cam member 20 and the engagement part 5a engages with arm 7b of each contact member, thereby opening up contact arms 7a and 7b.

BGA package 10 is placed on seating part 50 of slider 5 in the open contact arms state. The contact opening and closing jig 3 is then raised by the force of spring 21 in the direction indicated by arrow head C allowing cam member 20 to slide upwardly, thereby causing an action to take place which is opposite to that which has been described above. As a result, contact arms 7a and 7b of each contact member 7 are closed. Because of this, each solder ball 10a of the BGA package is compressively contacted by respective arms 7a and 7b of a contact member.

In the present embodiment as described, cam member 20 for moving slider 5 is provided on socket 2 and contact arms 7a and 7b of each contact member 7 are caused to open up by the action of the cam member. As a result, it becomes easier to control the positional accuracy of force receiving part 52 of slider 5 and cam member 20 within socket 2 without being dependent upon the accuracy of the parts of contact opening and closing jig 3. Accordingly, it becomes possible to set the amount of opening of contact arms 7a and 7b of each contact member 7 at a selected fixed distance. According to the above described embodiment, contact arms 7a and 7b are caused to open in a direction which is in parallel with diagonal line L along with the movement of slider 5 in a direction of the diagonal line L of base 4 and the cam member 20 is arranged at one corner on the diagonal line, thereby making it possible to provide only one cam member 20 for moving slider 5. Due to a decreased number of parts whose accuracy has to be controlled, it becomes possible to better control the amount of opening of the contact arms 7a and 7b of each contact member 7. By forming cam member 20 in the shape of a button, it becomes possible to employ one hand to press down cam member 20 in connection with unloading BGA package 10 from socket 2. As a result, there is an advantage in that the operability of such an unloading operation is improved. Moreover, the operability of the above-described unloading operation can be further improved as the exposure of seating portion 50 is optimized due to the location of cam member 20. Further, it is only necessary to provide force transfer member 33 for actuation of cam member 20 at one location on contact opening and closing jig 3 when using a single cam member 20 on socket 2. As a result, it becomes possible to reduce the weight and size of contact opening and closing jig 3 itself and further reduce the number of the parts thereof.

Figure 5:
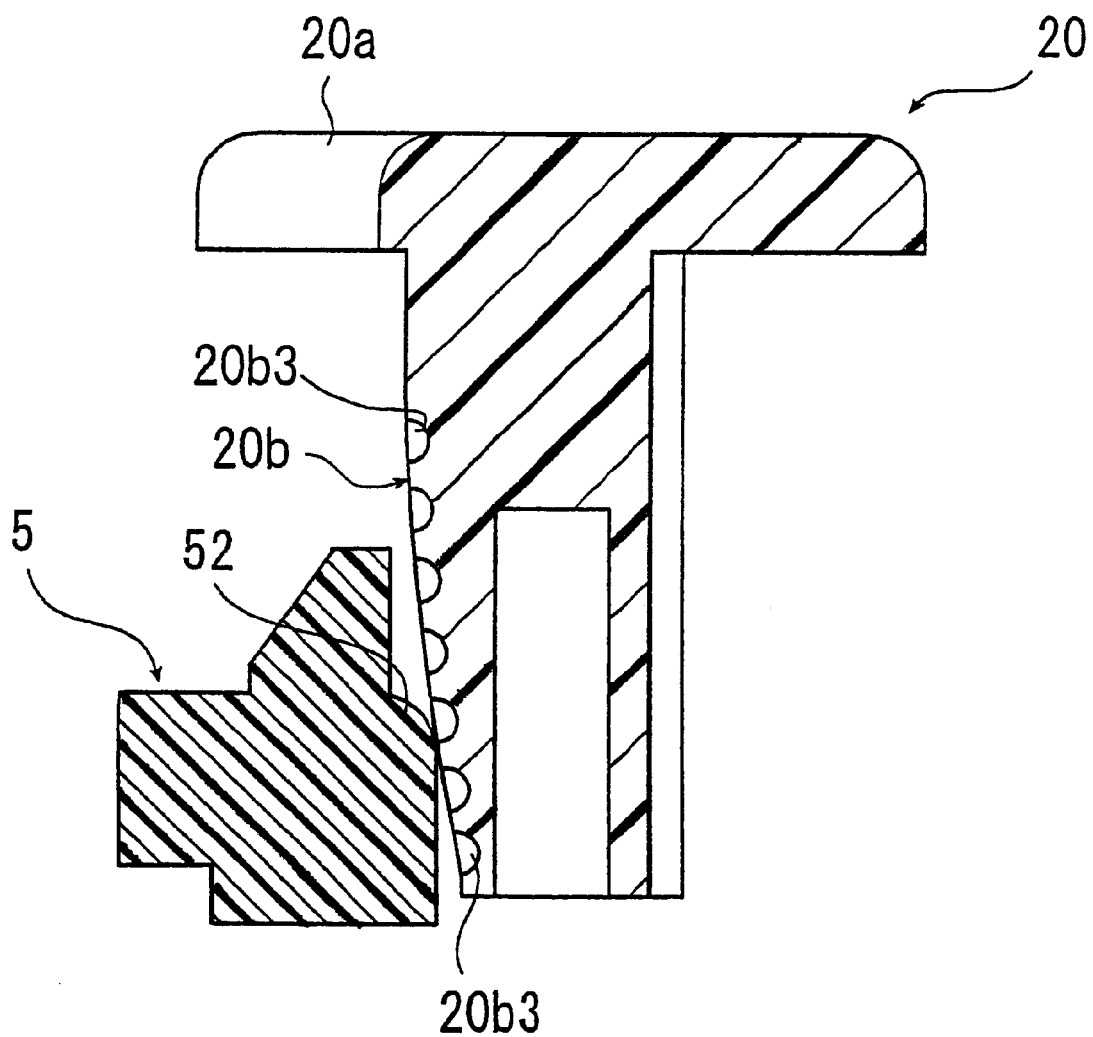
FIG. 5 is an enlarged cross sectional view of the force receiving cam follower portion of the slide member and a modified cam member.
Figure 6A:
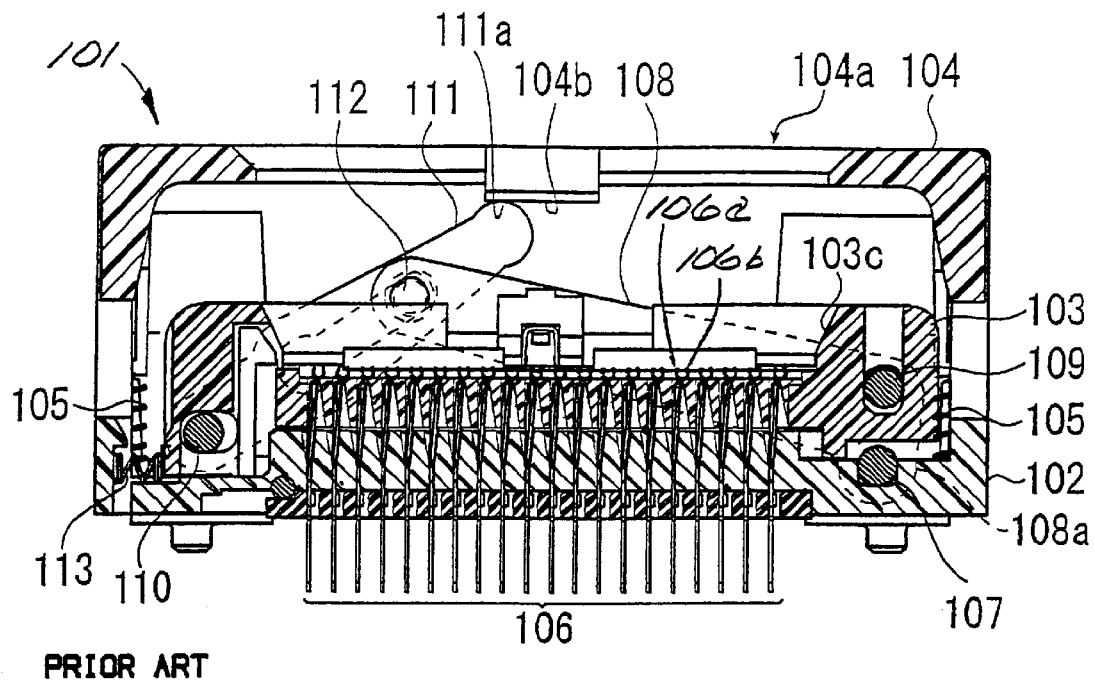
FIGS. 6(a) and 6(b) are cross sectional views showing a socket for burn-in tests made according to the prior art.
Figure 6B:
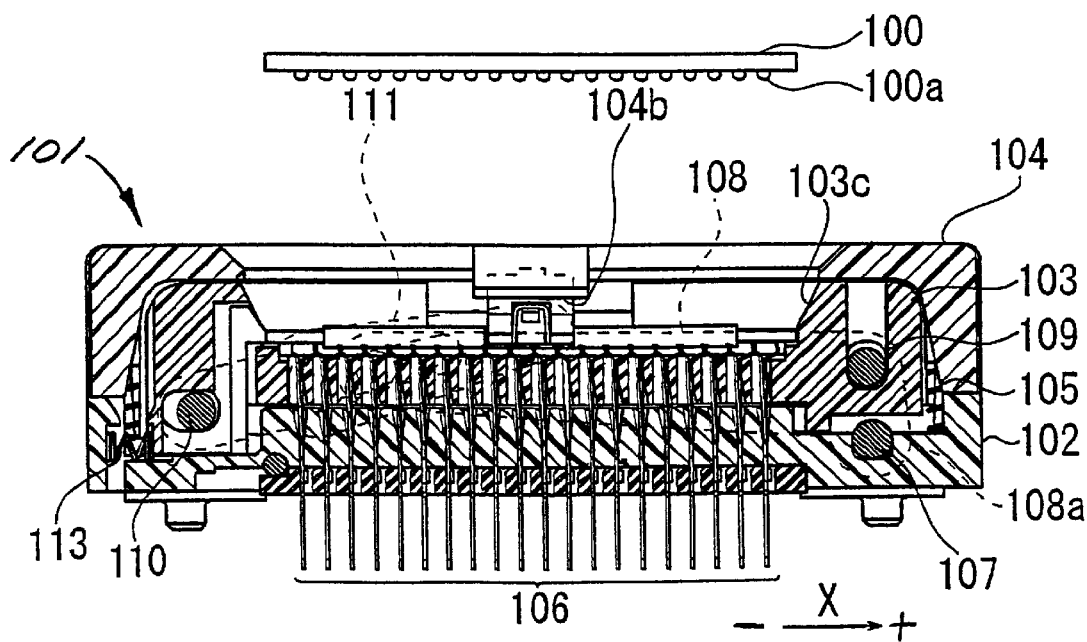

This invention is not to be restricted to the embodiment described above but can be modified in various ways, For example, the receiving part 52 of slider 5 and the cam follower portion 52 of slider 5 and the cam surface 20b of cam member 20 have curved surfaces for the purpose of reducing wear due to frictional resistance. If desired, as shown in FIG. 5, for instance, a plurality of depressions 20b3 of a selected size may be provided on cam surface 20b of cam member 20 so that the area of cam surface 20b2 that contacts cam follower portion 52 of slider 5 can be further reduced, thereby making it possible to further reduce the frictional resistance and wear of cam surface 20b2 of cam member 20 and cam follower portion 52 of slider 5.

In the above-described preferred embodiment, a resin containing glass fiber is used as the material of cam member 20. It is within the purview of the invention, however, to use a metal, for instance, in these materials. In such a case, if a lubricating layer (not shown in the drawing) is formed on cam surface 20b2 of cam member 20 to a selected thickness by using molybdenum disulfide or graphite, or the like, a greater effect can be achieved from the standpoint of reducing the friction resistance or wearing.

In the above-described embodiment, a cam mechanism is employed as a mechanism for converting vertical movement of cam member 20 to horizontal movement of slider 5. However, the invention is not restricted to this; for example, a linkage mechanism, etc., can also be used. From the standpoint of reducing the number of parts involved, however, it can be said that the cam mechanism shown and described is more advantageous.

It will be understood that the invention can be used not only for sockets for a burn-in test but also for sockets for an electrical property test. It can further be used not only for BGA packages but also for other packages such as PGA packages, and the like.

In the above-described embodiment, cam member 20 is arranged at a corner on the diagonal line L of base 4 in conformity with the movement of slider 5 in parallel with diagonal line L of base 4. However, it will be understood that slider 5 can be moved in parallel with one side of base 4 and a single cam member or a plurality of cam members can be arranged on the side which crosses, at a right angle, said one side of base 4.

Further, in the above-described embodiment, force applying member 33 is fixed to head 31 of contact opening and closing jig 3 and so that cam member 20 of socket 2 can be depressed along with movement of contact opening and closing jig 3. However, it is also possible to provide the force applying member so that it is separately moveable up and down on head 31 of the jig.

According to the invention which has been described above, a socket capable of bringing the amount of the opening of the contact arms to a preselected value can be obtained by using the socket side alone without depending upon the accuracy of the parts of the jig.

In view of the above, it will be seen that the several objects of the invention are achieved and other advantageous results are obtained.

As various other changes could be made in the above constructions without departing from the scope of the invention, it is intended that all matter included in the above description or shown in the accompanying drawings be interpreted as illustrative and not in a limiting sense.

What is claimed:

1. Socket apparatus comprising a base having a top surface and having an outer peripheral wall portion formed with a bore through the top surface and extending generally vertically relative to the top surface, a plurality of contact members mounted in the base in a selected arrangement, the contact members each having a pair of contact arms which are relatively movable between open and closed positions, a slider having an electronic part seating surface and having an engagement portion for engaging the contact members for moving the contact arms, the slider being slidably disposed on the top surface of the base and having an outer peripheral wall portion formed with a cam follower surface, a cam member having an elongated body of a selected length with a longitudinal axis and having an outer end, the body slidingly received in the bore of the base for generally vertical movement relative to the top surface of the base, a first spring member mounted in the base for urging the slider in a first contact closing direction, a second spring member mounted in the base for urging the cam member in a direction upwardly out of the bore, the cam member having a cam surface extending longitudinally along at least a portion of the length of the body, the cam follower surface being biased into engagement with the cam surface by the first spring member, the cam member having a force receiving surface at the outer end of the cam member whereby a force applied to the force receiving surface which depresses the cam member causes the cam surface to slide against the cam follower surface and move the slider and engagement portion in a second contact opening direction opposite to the first contact closing direction.

2. Socket apparatus according to claim 1 in which the body of the cam member is formed with a plurality of depressions in the cam surface to mitigate frictional resistance.

3. Socket apparatus according to claim 1 in which the bore in the base has a closed end and the length of the body of the cam member is selected so that the closed end serves as a stop for the cam member to provide a fixed position of the slider when the cam member engages the stop.

4. Socket apparatus according to claim 1 in which the base and the slider are generally square in top plan view having an imaginary diagonal line and the first spring member applies a force to the slider which is in a direction in parallel with the diagonal line and the first contact closing direction and the second contact closing direction are in parallel with the diagonal line.

5. Socket apparatus according to claim 1 in which the base and the slider are generally rectangular in top plan view having an imaginary diagonal line and the contact arms are relatively movable in a direction parallel with the diagonal line and the first spring member and the cam member are located along the diagonal line.

6. Socket apparatus according to claim 1 further comprising an electronic part holding mechanism movable toward and away from the base to load an electronic part on the seating surface, the electronic part holding mechanism having a force applying member aligned with and movable into engagement with the force receiving surface of the cam member.

7. Socket apparatus according claim 1 in which the cam surface is curved relative to the longitudinal axis.

8. Socket apparatus according to claim 1 in which the bore has a longitudinal axis and the cam follower surface is curved relative to the longitudinal axis of the bore.

9. Socket apparatus according to claim 7 in which the bore has a longitudinal axis and the cam follower surface is curved relative to the longitudinal axis of the bore when the slider is mounted on the base.

10. Socket apparatus according claim 4 in which the cam follower surface has a greater degree of curvature than degree of curvature of the cam surface.

11. Socket apparatus according to claim 1 in which the cam member is formed with a head having a flat force receiving surface which extends laterally beyond the body of the cam.

12. Socket apparatus according to claim 11 in which the area of the force receiving surface of the head is between approximately $1/10$ to $1/20$ of the area of the top surface of the base.

* * * * *